United States Patent [19]

Boles

[11] Patent Number: 6,040,225

[45] Date of Patent: Mar. 21, 2000

[54] METHOD OF FABRICATING POLYSILICON BASED RESISTORS IN SI-GE HETEROJUNCTION DEVICES

[75] Inventor: Timothy Edward Boles, Tyngsboro, Mass.

[73] Assignee: The Whitaker Corporation, Wilmington, Del.

[21] Appl. No.: 08/920,639

[22] Filed: Aug. 29, 1997

[51] Int. Cl.[7] .................................................. H01L 21/331
[52] U.S. Cl. ......................... 438/314; 438/318; 438/330; 438/332
[58] Field of Search ..................................... 438/312, 314, 438/318, 330, 332; 257/65, 538, 577, 581

[56] References Cited

U.S. PATENT DOCUMENTS

| | | | |
|---|---|---|---|
| 4,526,593 | 7/1985 | Meyerson | 55/385 |
| 4,647,494 | 3/1987 | Meyerson et al. | 428/216 |
| 5,008,207 | 4/1991 | Blouse et al. | 437/31 |
| 5,031,029 | 7/1991 | Acocella et al. | 357/81 |
| 5,159,508 | 10/1992 | Grill et al. | 360/103 |
| 5,246,884 | 9/1993 | Jaso et al. | 437/225 |
| 5,259,918 | 11/1993 | Akbar et al. | 156/610 |
| 5,316,958 | 5/1994 | Meyerson | 437/31 |
| 5,319,240 | 6/1994 | Faure et al. | 257/622 |
| 5,322,813 | 6/1994 | Beach | 437/88 |
| 5,378,922 | 1/1995 | Sovero | 257/582 |
| 5,461,243 | 10/1995 | Elk et al. | 257/190 |
| 5,534,079 | 7/1996 | Beach | 148/33 |
| 5,540,785 | 7/1996 | Dennard et al. | 148/33.2 |
| 5,607,511 | 3/1997 | Meyerson | 118/275 |
| 5,846,867 | 12/1998 | Gomi et al. | 438/318 |

OTHER PUBLICATIONS

Meyerson, B., "High Speed Silicon–Germanium Electronics", Scientific American, Mar. 1994, pp. 62–67.

Bean, J., "The Growth of Novel Silicon Materials", Physics Today, Oct. 1986, pp. 36–42.

Burghartz, J., et al., "Self–Aligned SiGe–Base Heterojunction Bipolar . . . ", IEEE Elec. Dev. Lett., vol. 11, No. 7, Jul. 1990, pp. 228–290.

Vook, D., et al., "Double–Diffused Graded SiGe–Base Bipolar Transistors", IEEE Trans. Elec. Dev., vol. 41, No. 6, Jun. 1994, pp. 1013–1017.

Karasawa, T., et al., "Thermal Stability of B–doped SiGe Layers . . . " Jpn. J. Apl. Phys., vol. 32, Pt. 1, No. 3A, 1993, pp. 1039–1044.

Dawe, G., et al., "SiGe Technology: Application to Wireless Digital Communications", Applied Microwave & Wireless, Summer 1994, pp. 14, 15, 17, 18, 20, 24.

Cressler, J., "Re–Engineering Silicon: SiGe Heterojunction bipolar technology", IEEE Spectrum, Mar. 1995, pp. 49–55.

Hobart, K., et al., "Si/$Si_{1-x}$ $Ge_x$ Heterojunction Bipolar Transistors . . . ", IEEE Elec. Dev. Lett., vol. 16, No. 5, May 1995, pp. 205–207.

Crabbé, E., et al., "73–GHz Self–Aligned SiGe–Base Bipolar Transistors . . . ", IEEE Elec. Dev. Lett., vol. 13, No. 5, May 1992, pp. 259–261.

Buzghartz, J., et al., "APCVD–Grown Self–Aligned SiGe–Base HBTs", IEEE Bipolar Circuits and Technology Meeting 4.1, 1993, pp. 55–62.

*Primary Examiner*—T. N. Quach

[57] ABSTRACT

A method that enables the fabrication of ballast resistors in polysilicon which can be fabricated in a manner so as to not relax the strained layers in the lattice of the silicon germanium transistor wherein the high temperature steps, associated with activating dopants to fabricate resistors with desired resistance values, are performed prior to the deposited epitaxial layers of silicon germanium.

7 Claims, 6 Drawing Sheets

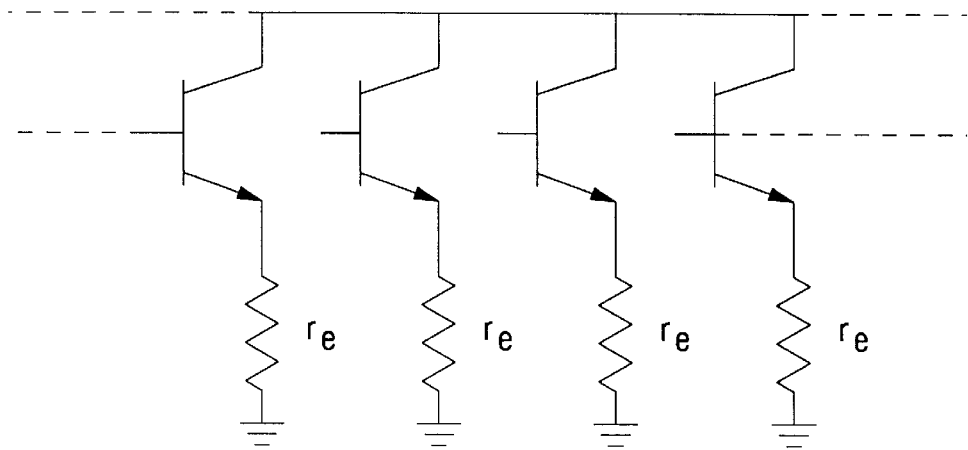
Fig. 1
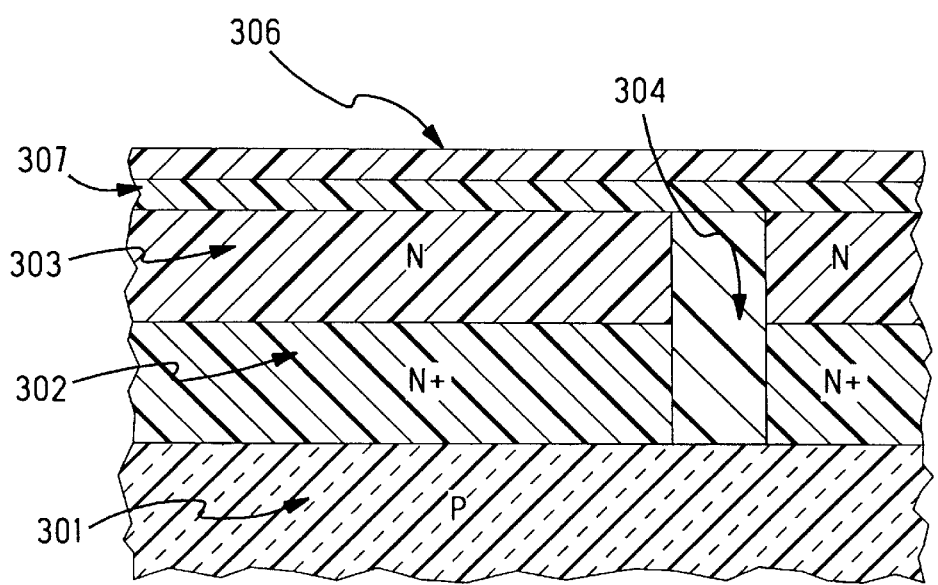
Fig. II

METHOD OF FABRICATING POLYSILICON BASED RESISTORS IN SI-GE HETEROJUNCTION DEVICES

FIELD OF THE INVENTION

The present invention relates to a technique for fabricating semiconductor resistors in Se-Ge HBT structures.

BACKGROUND OF THE INVENTION

Silicon germanium epitaxially grown alloys provide a promising solution to high frequency, high speed devices in readily available, low cost silicon based structures. The evolution of silicon germanium materials and technologies has occurred quickly. With cutoff frequencies in excess of 100 GHz, silicon germanium can achieve switching speeds of comparable III-V semiconductor devices. The energy bandgap of an alloy of silicon germanium is smaller than it is for silicon, lying between the intrinsic bandgap of silicon (1.12 eV) and germaniums (0.66 eV). The bandgap is reduced further by the compressive strain in the alloy layer, with the bandgap reducing even further with increasing germanium content.

In strained lattice structure silicon germanium alloys, grown on a silicon substrate, a bandgap reduction is due to a valence band offset. The conduction and valence band edges of the strained layers of the alloy of silicon germanium lie within the band edges of the underlying silicon, which has attendant benefits in bandgap engineering to fabricate fast switching speed transistors. Furthermore, the low pressure chemical vapor deposition technique employed by Myerson et al. as is disclosed in U.S. Pat. No. 5,298,452, the disclosure which is specifically incorporated herein by reference, allows for a controlled grading of germanium concentration across the base layer.

The smaller bandgap of the alloy of silicon and germanium in a heterojunction bipolar transistor (HBT) is utilized as follows. The reduction in the base bandgap due to the intrinsically reduced bandgap of the silicon germanium alloy compared to silicon is produced at the emitter-based junction. The base bandgap junction exponentially increases the collector current for a particular bias voltage, resulting in a large increase in current gain when compared with bipolar homojunction transistors in silicon. By adding the germanium to the emitter-base junction, the potential barrier is lower at the junction, and for a given bias voltage, more electrons are injected from the emitter to the base where they contribute to collector current. Additionally, by grading the junction across the base region, the conduction band edge in the base becomes dependent upon the position in the base, resulting in an electrostatic field within the base region. The static field accelerates the injected minority carriers traversing the base. This reduces the base transit time and increases significantly the frequency response of the device. Additionally, silicon germanium alloy in the base region improves the output resistance of the transistor.

While silicon germanium alloys have met with great success in a variety of HBT structures and applications, it is desirable to utilize such a structure in high power applications. As is well known to one of ordinary skill in the art, ballasting is often necessary in high power transistor applications. To this end, with higher power, higher temperatures of operation result in an increased current at the collector which in turn increases the temperature of the device. The relationship of PN junction diode current and temperature is well known, and clearly the increase in temperature results in an increase in current which in turn results in an increase in temperature. This self-feeding problem is known as thermal runaway and must be remedied. Furthermore, in power devices, thermal runaway occurs because parallel devices are not all identical and do not have identical heat dissipation capability. When one HBT get slightly hotter than a neighboring device, it begins to carry more current, which results in an increase in its temperature, which increases its current, and so forth. This unstable condition can rapidly lead to the destruction of the operation of the entire device. As a particular unit device is destroyed, the remaining devices begin to carry more current which increases the temperature and increases the likelihood of their ultimate destruction. A generally accepted way of controlling thermal runaway problems is to place a fixed resistance in series which each emitter of the transistors which are connected and parallel. This emitter resistance is preferably identical in each transistor with a magnitude of three to ten times the intrinsic impedance of the device. In this matter, the current level in each transistor is essentially the same.

Conventional methods used to fabricate emitter resistance in power devices is for example the fabrication of a NiCr thin film metal resistor connected to the emitter by well known techniques. Unfortunately, thin film metals in power devices often end up acting as mere fuses. In order to circumvent this problem, thicker metal films were tried, to handle the current levels of power devices. Unfortunately, due to the relatively low sheet resistance of the thick metal films, this approach results in physically long resistors which can add unwanted parasitic inductance levels at higher frequencies. One possible alternative technique for fabricating emitter resistance for ballasting is the use of polysilicon which is appropriately doped to the proper resistance level. For example, doping polysilicon with a suitable dopant of boron, arsenic, or phosphorous is an alternative to metal resistors. However, certain process issues are raised during this fabrication step. As stated earlier, the reduction in the bandgap of silicon germanium is put to great use in the HBT structure of Si—SiGe—Si structures. While the reduction in the bandgap of a silicon germanium alloy is partly due to the fact that germanium reduces the silicon bandgap, it is of course important to note that the bandgap is further reduced by the compressive strain in the alloy layer. To this end, as stated above the bandgap is reduced even further with increasing germanium content than might otherwise be expected. At high temperatures, the silicon germanium lattice structure of the alloy relaxes, reducing significantly the benefit gained in the bandgap engineered via the strained layers of silicon germanium. Accordingly, in the fabrication of ballast resistors, it is necessary to avoid exposure of the silicon germanium alloy to the high temperatures. One possible approach would be to fabricate the resistors at a low temperature. Unfortunately, for the sheet resistance values desired, on the order of 50–250 Ohm/square conductivities cannot be achieved at low temperatures.

Accordingly, what is needed is a technique which enables the fabrication of ballast resistors in polysilicon which can be fabricated in a manner so as not to relax the strained layers in the lattice of the silicon germanium transistor.

Summary of the Invention

The present invention relates to a process for fabricating semiconductor based resistors for various applications in silicon-germanium based heterojunction bipolar transistor structures. The technique of the present invention enables the fabrication of resistors which overcome the inductance issues posed by metal resistor films and enables the benefit of semi-conductor based, preferably polysilicon based, resistors. By the process of the present invention, the high temperature steps associated with activating dopants to fabricate resistors with the desired resistance values is carried out prior to the deposited epitaxial layers of silicon germanium. By undergoing this approach, the problems associated with relaxation of the silicon-germanium lattice structure and the resultant loss of the benefits of the bandgap engineering that the silicon-germanium allows is avoided. The resistors must be activated at high temperature which is deleterious to the Si—Ge lattice. Accordingly, this is done prior to depositing the Si—Ge layer for the base to avoid harm to the lattice.

BRIEF DESCRIPTION OF THE DRAWINGS

FIG. 1 shows a typical circuit for a high power amplifier applications where the heterojunction by polar transistors are in parallel and have ballast resistors connected to the emitters.

FIG. 11 is a cross-sectional view of a subcollector layer in a mesa structure.

DETAILED DESCRIPTION OF THE INVENTION

Figure 7:
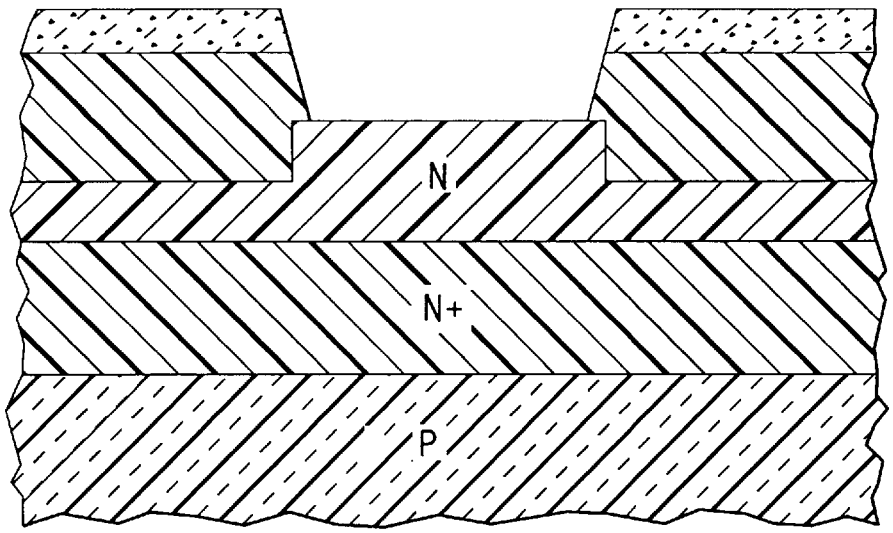
FIG. 3–9 shows the fabrication steps to effect the device of the present disclosure.

Turning to FIG. 11, a typical structure in which an isolating p-type subcollector layer 301 has disposed thereon a epitaxially grown n$^+$ collector contact layer 302 with the collector layer 303 epitaxially grown thereon. In structures such as shown in FIG. 12, an access or via region 304 of n$^+$ silicon 304 is grown for effecting contact with an ohmic contact layer (not shown). In many applications, the isolating sub-collector layer can be forgone with direct contact made to the layer 302. For purposes of discussion, this will be the exemplary embodiment. After the growth of the n-type silicon collector layer, consecutive layers of silicon dioxide 305 and silicon nitride 306 are grown. The pad oxide layer 305 is on the order of 200 angstroms in thickness, while the nitride layer is on the order of 1200 angstroms. The pad oxide layer is grown by conventional techniques, to include conventional thermal oxidation techniques. The nitride layer can be fabricated using conventional chemicals vapor deposition techniques, but is deposited preferably by low pressure chemical vapor deposition (LPCVD). The pad oxide layer has the nitride layer grown thereon to prevent further oxidation.

Figure 3:
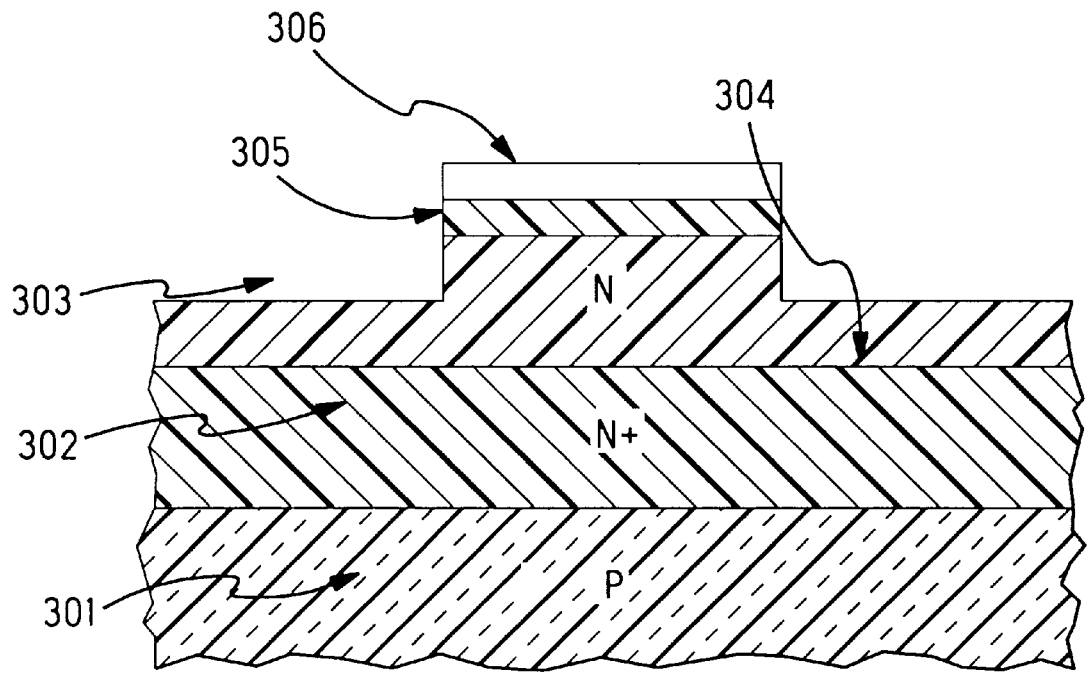
Figure 4:
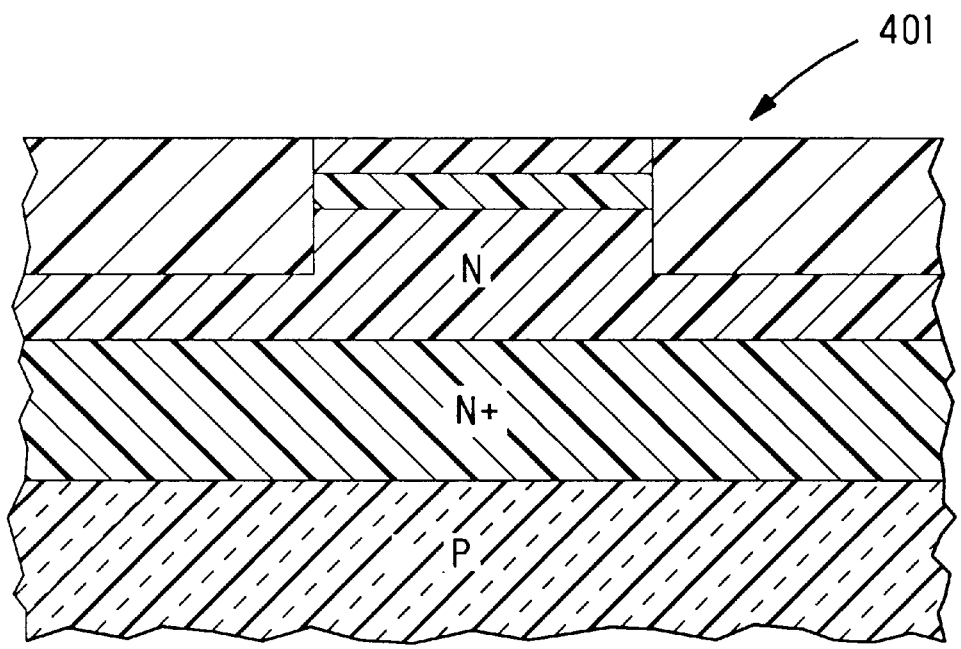
Figure 5:
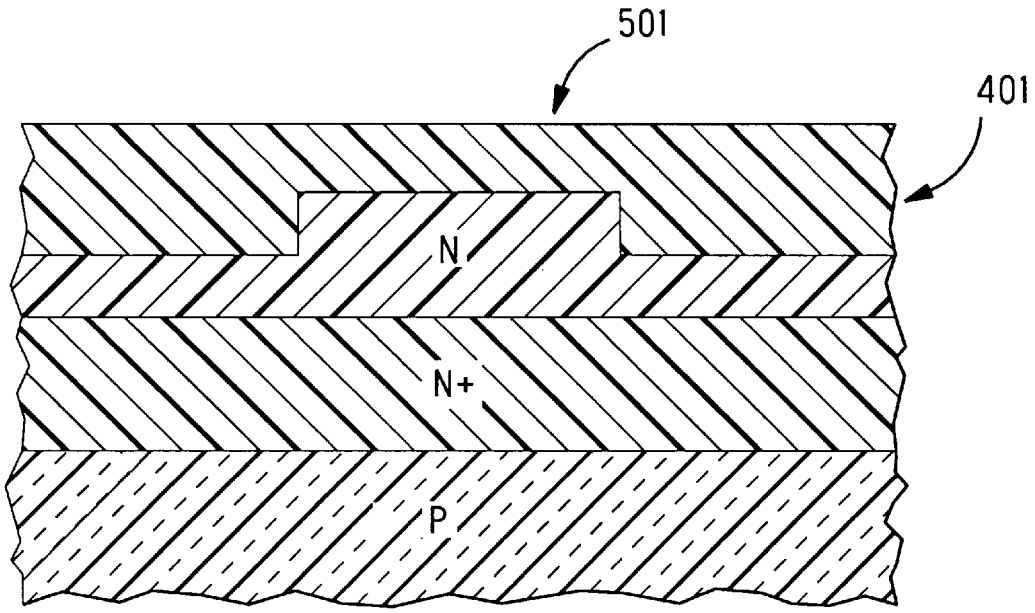

Turning to FIG. 3, the oxide and nitride layers 305, 306 are patterned and the n-type layer 303 is selectively etched for the formation of oxide. After this step, as is shown in FIG. 3, a relatively thick layer of oxide is grown by the technique of localized oxidation of silicon (LOCOS) 401 well known to one of ordinary skill in the art. This is effected by standard technique, for example as is discussed in VLSI *Fabrication Principles Silicon and Gallium Arsenide, 2$^{nd}$* Edition by Ghandi pp. 714–719, the disclosure which is specifically incorporated herein by reference. Thereafter, as is shown in FIG. 4, the remaining layers of nitride and oxide on the mesa, 305 and 306, respectively, are removed and a layer on the order of 400 angstroms of LOCOS is formed on the mesa. This layer of oxide 501 has a known thickness on the order of 400 angstroms. While the thickness is important, it is not critical and only has to be thick enough to prevent dry etch damage during the etch at the next step in the process and thin enough to not cause a deep hole for printing of the fine line structures at the emitter, base, collect metallization step.

Figure 6:
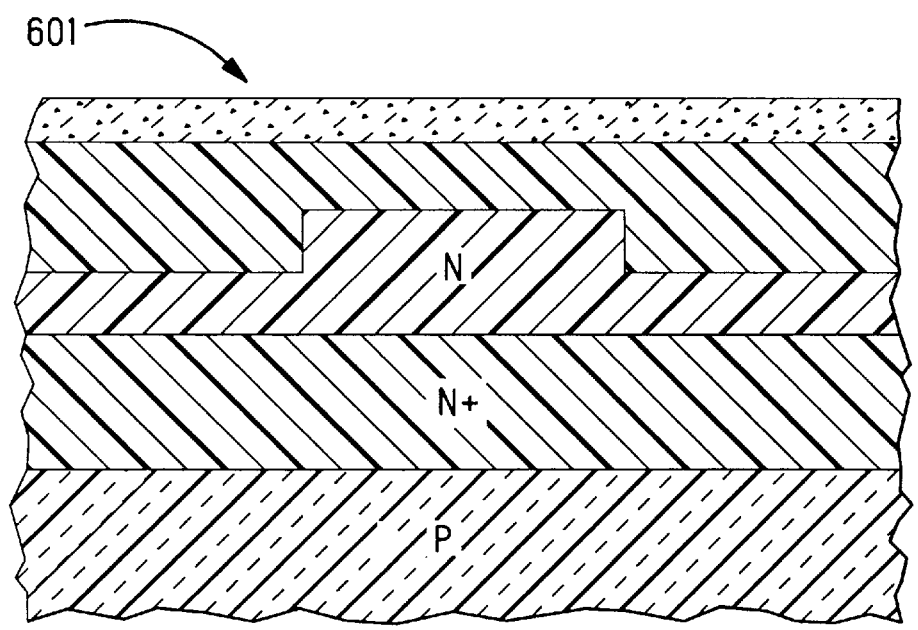

After the final fabrication of the oxide layer in appropriate thickness, a continuous film of polysilicon is deposited by standard techniques as is shown in FIG. 6 at 601. After the deposition of the polysilicon, boron, arsenic, or phosphorous is used as a dopant in selected regions of the polysilicon in order to fabricate the ballast resistors of the present disclosure. At this step, the dopant in the polysilicon film is activated at a relatively high temperature on the order of 1050 degrees Celsius. If the silicon germanium base region had been fabricated prior to this step, the problems discussed above with the relaxation of the lattice would have occurred. However, by virtue of the suitable timing of this activation step, the problems of lattice relaxation are avoided.

Figure 2:
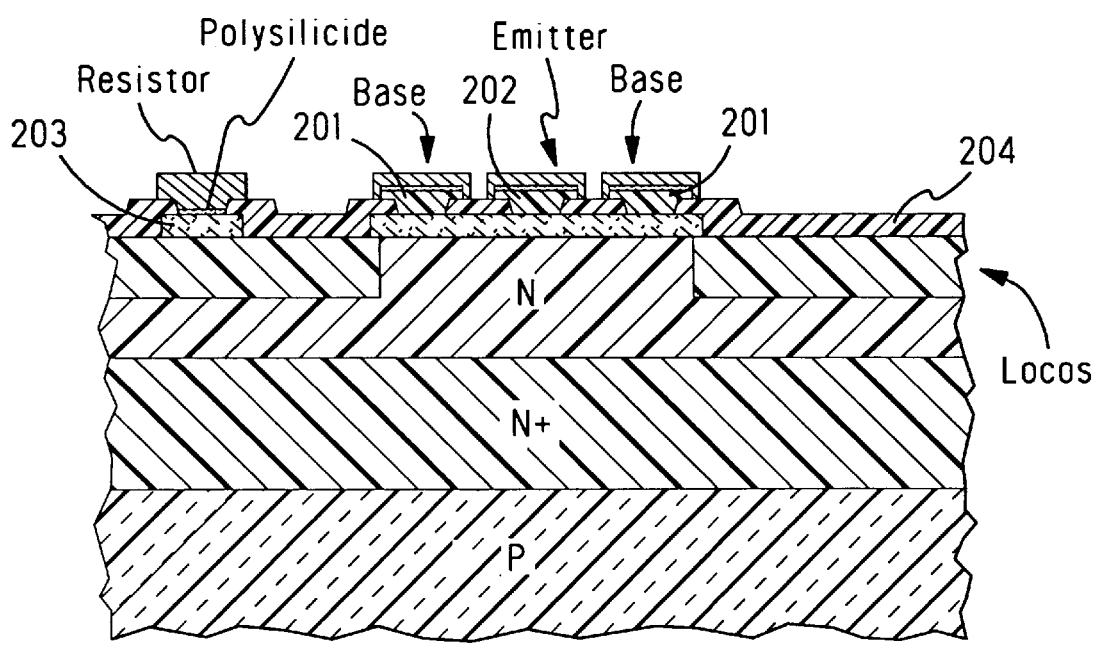
FIG. 2 shows a cross-sectional view of the device of the present disclosure.
Figure 8:
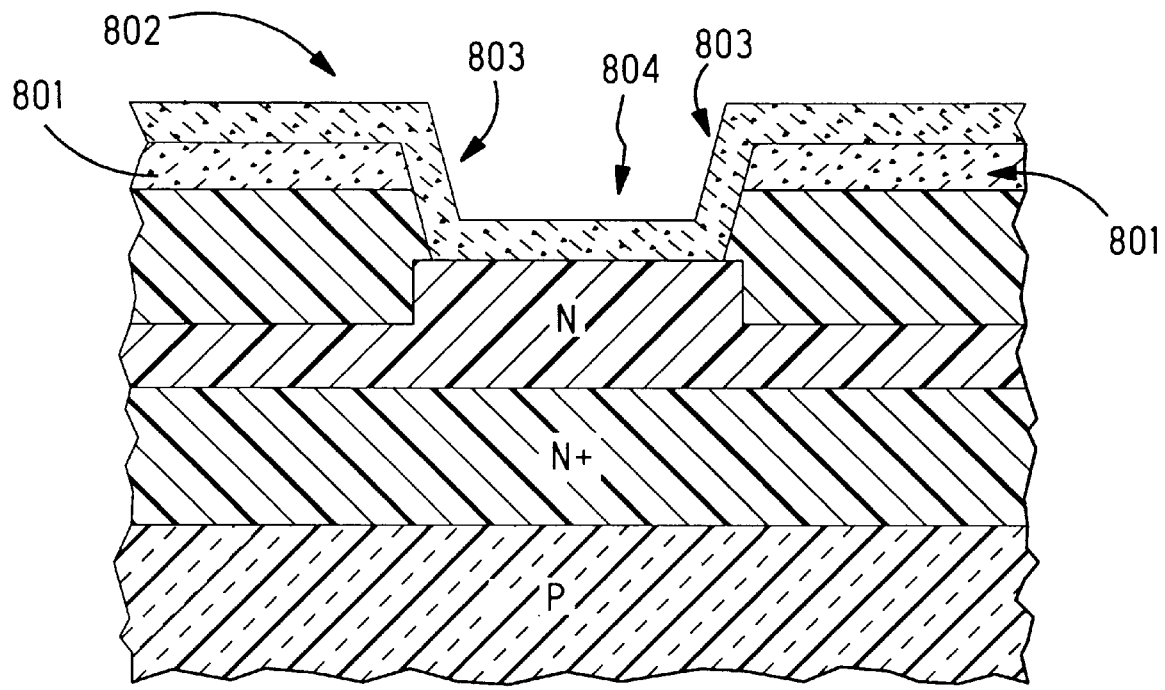
Figure 9:
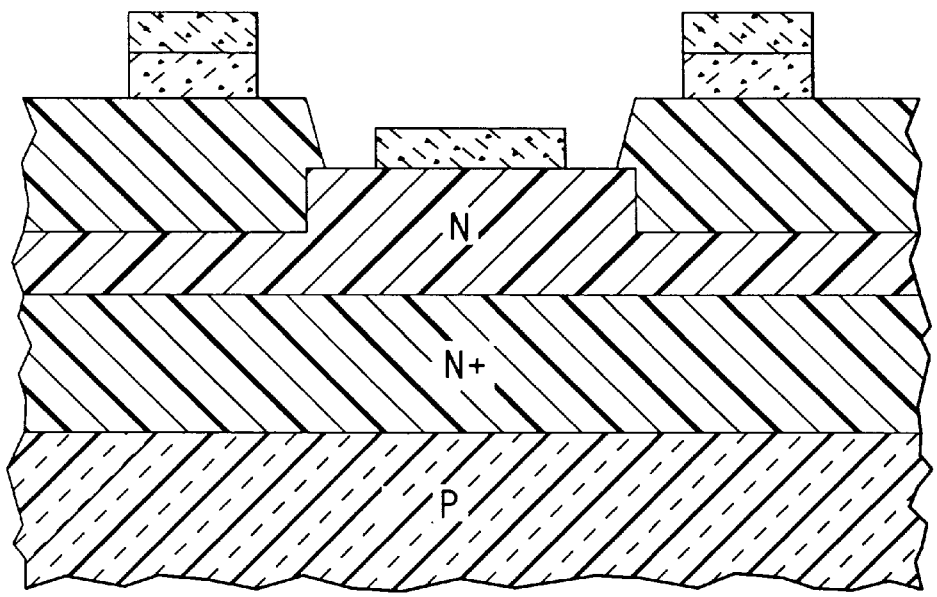
Figure 10:
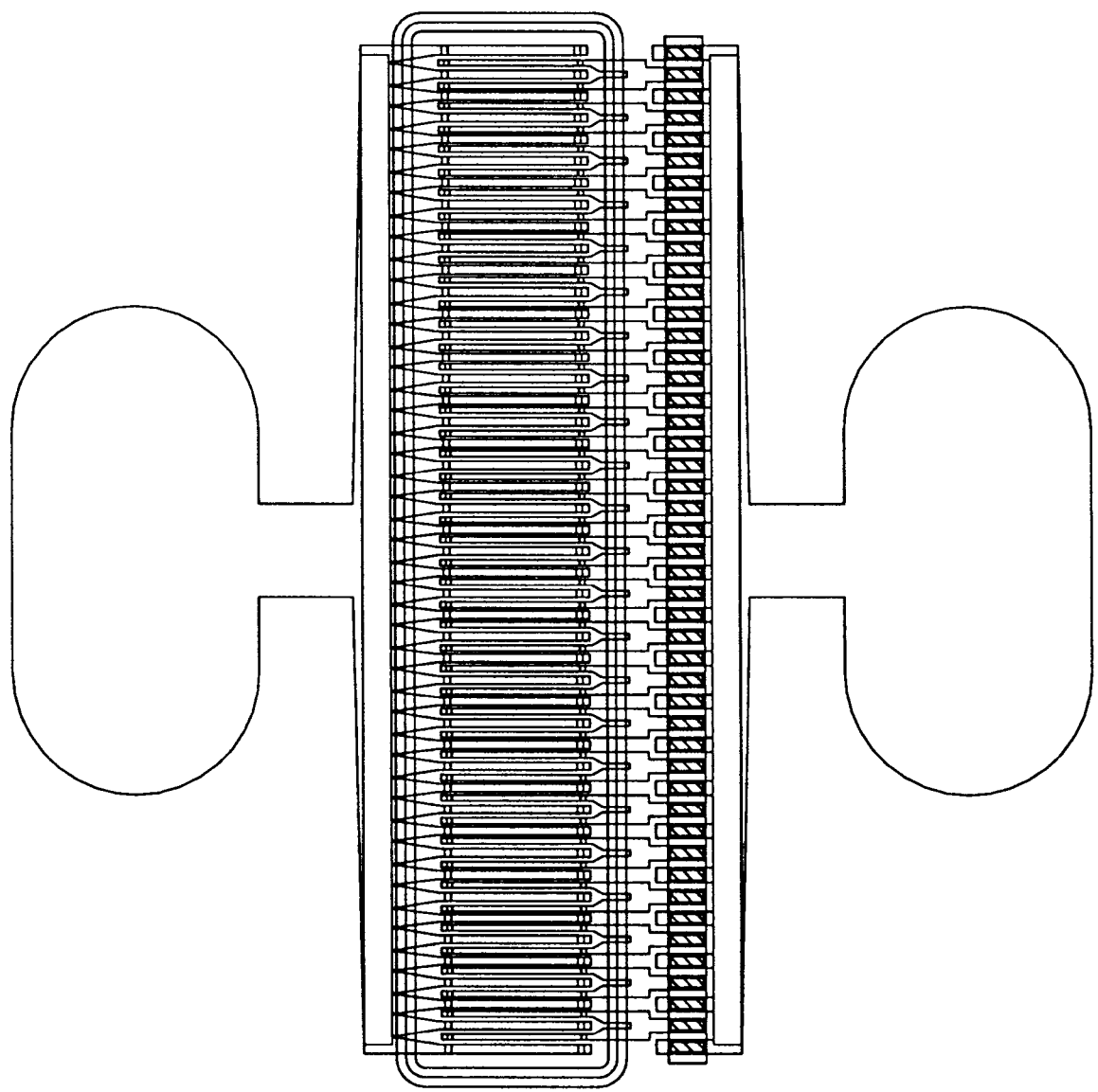
FIG. 10 is a top view of the inter-digitation of contacts for the device of the present disclosure.

After a standard photo-resist/wet etch step to expose the mesa shown in FIG. 7, low pressure CVD results in epitaxial layers of silicon germanium by standard technique as is disclosed in the above referenced patent to Myerson, is carried out. As is shown in FIG. 8, in the regions where the polysilicon layer 801 has the silicon germanium deposited thereon, a layer of polycrystalline silicon germanium is formed. This is shown at 802. Furthermore, on the sidewalls shown at 803 of polysilicon and LOCOS oxide layer, polycrystalline silicon germanium is fabricated. However, at the epitaxial layer of the mesa, single crystal silicon germanium of high quality is fabricated as is shown at 804. This fabrication step which forms single crystal silicon germanium on the single crystal silicon and polycrystalline silicon germanium at all other places as shown in FIG. 8 is the subject of U.S. patent application (08/870,219) U.S. Pat. No. 5,976,941 to Goodrich et al., the disclosure which is specially incorporated herein by reference. Finally, as is shown in FIG. 9, selective etching is effected, leaving the single crystal base 901 and regions with a layer of polysilicon and poly Si—Ge 902. The final structure is shown in FIG. 2, with the steps of depositing a photo-resist and patterning and the deposition of a low temperature oxide of a thickness on the order of 2000 angstroms. After the low temperature oxide is deposited, it is patterned and etched to open holes to form a self-aligned pattern for the emitter and base contacts to the silicon germanium layer and to contact the resistors. After formation of the self-aligned emitter, base contact, resistor contact pattern in the low temperature oxide, a second continuous film of polysilicon is deposited by standard techniques. After the deposition of the polysilicon, boron and phosphorous is selectively implanted into the polysilicon in the regions directly above the base contacts openings and above the emitter openings respectivly using standard photolithographic processes as implantation masks. This implantation of boron and phosphorous are employed as dopants in selected regions of the polysilicon in order to facilitate contact to the silicon germanium base region and to form the heterojunction emitter structure respectively of the present disclosure. The polysilcon is then patterned via standard photolithoghraphic and etch processes. At this step, the boron and phosphorous dopants in the polysilicon film is activated at a relatively low temperature (800 C.) so as to not relax the strained silicon germanium lattice.

After this final thermal cycle, contact is made to the individual emitter, base and resistor contacts via standard silicide and metallization techniques. The emitter and emitter contact is shown at 202. The base and base contact is shown at 201 and the resistor and resistor contact is shown at 203. (For the case of the p-type substrate, contact to the collector would be also made simultaneously at this point).

The final product is shown in FIG. 2 in cross-section. The device of the present disclosure, a high power amplifier based on Si—Ge technology has the attendant benefits of high frequency applicability due to the superior performance characteristics of Si—Ge devices. The issues of thermally run-away are avoided by suitable ballasting with semiconductor resistors in polysilicon, while the preservation of lattice structures in Si—Ge, which are so advantageous to devices, are preserved. While the inventor has disclosed the preferred embodiment and best mode for carrying the invention at the time of filing the application, it is clear that modifications of the teaching of the present disclosure are within the purview of the artisan of ordinary skill. Such modifications are within the scope of the invention.

I claim:

1. A method of fabricating polysilicon based resistors in silicon-germanium heterojunction devices, the method comprising the steps of:

growing a single crystal silicon collector layer on a substrate;

growing a first oxide layer of a first thickness on said collector layer and depositing a nitride layer of a second thickness on said first oxide layer;

patterning said first oxide and said nitride layers and etching said collector layer to form a mesa;

growing an isolating layer by localized oxidation of silicon (LOCOS) of a third thickness;

removing any remaining first oxide layer and nitride layer;

growing an isolating layer by localized oxidation of silicon (LOCOS) of a fourth thickness;

depositing a layer of polysilicon on the isolating layer of a fourth thickness and selectively doping with a dopant, said polysilicon layer to form at least one resistor;

activating said dopant by heating to a predetermined temperature;

patterning and etching the polysilicon layer and the isolating layer of a fourth thickness to expose said mesa;

depositing a layer of epitaxial silicon-germanium alloy on said mesa of single crystal silicon, said silicon-germanium layer being a base layer; and depositing a layer of single crystal silicon on said silicon-germanium layer, said layer of single crystal silicon being an emitter layer.

2. A method as recited in claim 1, wherein said first oxide is silicon dioxide having a thickness of 200 Angstroms.

3. A method as recited in claim 1, wherein said nitride layer is silicon nitride has a thickness of 1200 Angstroms.

4. A method as recited in claim 1, wherein said LOCOS layer of a third thickness has a thickness in the range of 6000 to 12000 Angstroms.

5. A method as recited in claim 1, wherein said predetermined temperature is on the order of 1050 degrees Celsius.

6. A method as recited in claim 5, wherein said polysilicon is doped with boron.

7. A method as recited in claim 1, further comprising the steps of:

depositing a layer of low temperature oxide in a thickness of about 2000 Angstroms on the single crystal silicon layer;

patterning and etching said oxide to form a self-aligned pattern for emitter, base and resistor contacts;

depositing a second continuous layer of polysilicon and implanting dopants in selected region of said second layer of polysilicon;

activating said implanted dopants at a temperature on the order of 800 degrees celsius; and contacting emitter, base and resistor contacts, determined by said self-aligned pattern for emitter, base and resistor contacts, by silicide deposition and metallization.

* * * * *